INVENTOR
JOSEPH A. ABOAF

BY Thomas J. Kilgannon Jr.
ATTORNEY

United States Patent Office 3,721,589 Patented Mar. 20, 1973

3,721,589

METHOD FOR DIFFUSING ZINC INTO A SEMICONDUCTOR SUBSTRATE WITHOUT WINGING

Joseph A. Aboaf, Peekskill, N.Y., assignor to International Business Machines Corporation, Armonk, N.Y.

Filed May 4, 1970, Ser. No. 34,914
Int. Cl. H01l 7/36
U.S. Cl. 148—188 15 Claims

ABSTRACT OF THE DISCLOSURE

A method of diffusing zinc into gallium arsenide without winging is disclosed. Zinc silicate is utilized as a diffusion source while silicon nitride and aluminum oxide are utilized to mask selected areas of a gallium arsenide substrate such that the diffused regions are precisely defined within the substrate. The use of these materials as diffusion source and mask prevent winging, i.e., lateral spreading of the diffusant at the interface between the mask material and the gallium arsenide substrate.

BACKGROUND OF THE INVENTION

Field of the invention

This invention relates generally to a method of diffusing dopants into semiconductor substrates and more particularly relates to a method for diffusing zinc from a zinc silicate diffusion source into a semiconductor substrate such as gallium arsenide or other compound made of elements of Group III and Group V of the Periodic Table of the Elements. Ternary compounds such as gallium aluminum arsenide ($GaAs_{1-x}Al_x$) are also suitable as substrates. This method is particularly applicable to the integrated circuit art because it permits the manufacture of devices such as diode arrays in which the density is high because the winging phenomenon is controlled.

DESCRIPTION OF THE PRIOR ART

The prior art has partially recognized the problems associated with diffusing into semiconductor substrates using doped oxides or doped semiconductors as diffusion sources. In the prior art, it was recognized that evaporation of the dopant was undesirable and an oxide layer free of dopant was placed over the delineated diffusion source to prevent evaporation. This technique eliminated the need for diffusion window formation. Prior art techniques dealt with conventional dopants such as boron and arsenic and with conventional semiconductor substrate materials such as germanium and silicon. Using these and other similar materials, one can expect a certain amount of sideways or lateral diffusion of the dopant in the semiconductor substrate and there is nothing that can be done to limit this lateral diffusion. Using dopants such as zinc, a problem arises which is not addressed by the prior art. When diffusion of zinc from a zinc vapor through a diffusion window is attempted, zinc spreads laterally along the interface between the oxide mask and the semiconductor and some zinc even penetrates through the oxide mask. This results in a lateral diffusion or winging which is several times greater than the normally expected lateral diffusion using conventional dopants. Attempts to control winging using silicon dioxide wherein a zinc diffusion source was covered with silicon dioxide were ineffective to control winging. Other systems using various oxides, nitrides and specific diffusion sources did not control winging until the method of the present application was successful. The method involved herein provides specific masking and diffusion source combinations which substantially eliminate winging and permit the manufacture of arrays of diodes in densities which formerly could not be achieved because of the area required to accommodate to the winging problem.

SUMMARY OF THE INVENTION

In accordance with the broadest aspect of the invention, a method of diffusing zinc into a semiconductor substrate without excessive laterial diffusion or winging is disclosed.

In accordance with more particular aspects of the invention, a zinc diffusion source of zinc silicate is deposited on a portion of the surface of a gallium arsenide or other Group III–V compound substrate. A masking material of aluminum oxide or silicon nitride is deposited on the remaining portion of the substrate and diffusion of zinc from the zinc silicate diffusion source is carried out by heating the substrate diffusion source and mask to an appropriate temperature. The depositions on the portions of the substrate may be accomplished in two ways:

(a) By depositing and delineating by etching a diffusion source consisting of zinc silicate resulting from the thermal decomposition of zinc propionate and tetraethyl ortho silicate from the vapor phase. The delineation of the diffusion source is accomplished by photolithographic masking and etching in the usual way. After delineation, a mask of either aluminum oxide or silicon nitride is deposited over the diffusion source and the exposed surface of the semiconductor substrate. Aluminum oxide is formed by heating aluminum isopropoxide in the vapor phase in nitrogen to a temperature sufficient to cause thermal decomposition of the isopropoxide. $Al_2O_3$ film can also be deposited by sputtering from an alumina cathode (as described in "Argon Content of $SiO_2$ Films Deposited by RF Sputtering in Argon," in IBM J. Res. Develop., vol. 14, No. 1, January 1970, p. 52). Silicon nitride is formed by the thermal decomposition of silicon bromide and ammonia in the vapor phase;

(b) By depositing and delineating a mask of aluminum oxide or silicon nitride in the manner indicated above, depositing zinc silicate over the mask and on the exposed surface of the semiconductor substrate in the manner described above and heating.

Using both of the above approaches, excessive lateral diffusion or winging of zinc is eliminated. In a preferred method, the zinc silicate ($x$ZnO·$y$SiO$_2$) diffusion sources should contain ZnO in amounts less than fifty percent by weight. Where the amount is greater than fifty percent, the zinc tends to pass directly through the mask.

It is, therefore, an object of the invention to provide a method for preventing the excessive lateral diffusion of zinc in semiconductor substrates.

Another object is to provide a method of controlling the lateral diffusion of zinc to permit the fabrication of denser arrays of diodes than previously available.

The foregoing and other objects, features and advantages of the invention will be apparent from the following more particular description of preferred embodiments of the invention as illustrated in the accompanying drawings.

DETAILED DESCRIPTION OF PREFERRED EMBODIMENTS OF THE INVENTION

Figure 1:
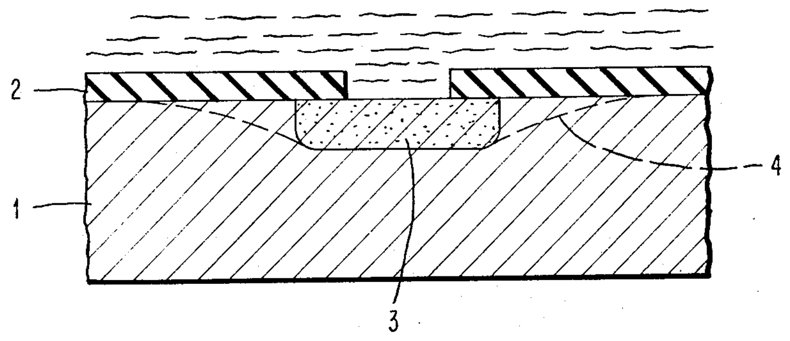
FIG. 1 PRIOR ART
FIG. 1 is a cross-sectional view of a semiconductor substrate undergoing vapor diffusion of a dopant into a selected area of the substrate via an aperture in a masking material. The extent of lateral diffusion normally expected is shown in solid lines while the extent of lateral diffusion using the usual techniques with zinc as a diffusant is shown in dotted lines.

Referring now to FIG. 1, there is shown a semiconductor substrate 1 having an apertured layer 2 of masking material disposed on its surface. Using ordinary dopants such as boron, arsenic, antimony, etc., a diffused region 3 bounded in a solid line is formed by heating substrate 1 to an appropriate temperature in a vapor of the desired dopant. This is a prior art technique which uses silicon dioxide for apertured masking layer 2. Note that diffused region 3 extends laterally the same distance as it extends vertically.

Figure 2:
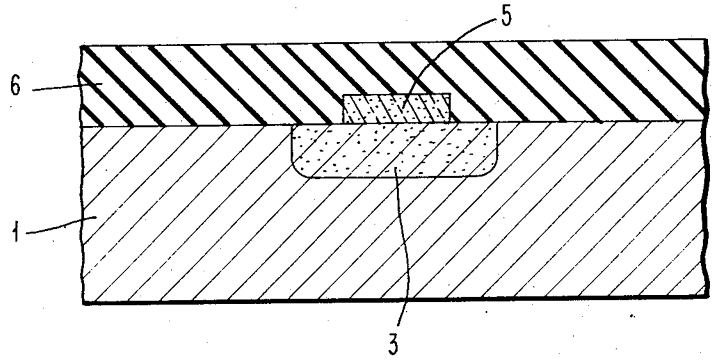
FIG. 2 shows a cross-sectional view of a semiconductor substrate with a zinc silicate diffusion source disposed on its surface enclosed on three sides by a masking material.

Under the same circumstances, except that zinc is the diffusant, the diffused region formed is bounded by dotted line 4. The lateral extent of the diffusion is much greater than the vertical extent of the diffusion and because of its appearance it is characterized as winging. From FIG. 1, it should be clear that because of winging the p-n junction formed by diffusion takes up a much larger projected area the surface of substrate 1 than the projected area at the surface required by diffusion 3. Eliminating winging or excessive lateral diffusion is, therefore, a significant advance in view of its impact on the density of devices in integrated circuit arrays.

Where zinc is required as a diffusant to form light emitting p-n junctions in substrates formed of gallium arsenide, other Group III–V compounds, or related ternary compounds such as gallium aluminum arsenide, one approach which prevents winging is shown in FIG. 2. FIG. 2 shows a substrate of semiconductor material such as gallium arsenide with a diffusion source 5 disposed on a portion of its surface. Diffusion source 5 is preferably zinc silicate ($x\text{ZnO}\cdot y\text{SiO}_2$) with ZnO preferably appearing in amounts less than fifty percent by weight. As the amount of ZnO is increased, zinc tends to pass directly through masking material.

Diffusion source 5 of zinc silicate is formed by the thermal decomposition of zinc propionate and tetraethyl ortho silicate in the vapor phase. Substrate 1 is disposed in a deposition chamber; the appropriate constituents admitted in the vapor phase and, by thermal decomposition, zinc silicate is formed on the surface of substrate 1. A detailed description of the method and apparatus utilized in the formation of zinc silicate will be given in connection with FIG. 4. After deposition of a layer of zinc silicate, diffusion source 5 is formed by depositing a layer of photoresist on the surface thereof and exposing the resist through a mask. Commercially available photoresists, well known to those in the semiconductor art, may be utilized. After development of the photoresist, the unexposed areas are removed by a suitable solvent. A photoresist mask is then formed which is resistant to most conventional etches. For zinc silicate, a suitable etch is diluted HF. All of the zinc silicate which is not covered by the photoresist mask is removed leaving diffusion source 5 disposed on a portion of the surface of substrate 1. The photoresist mask is then removed by a suitable stripping agent.

In a subsequent step, a mask 6 of either aluminum oxide ($Al_2O_3$ )or silicon nitride is deposited or formed over diffusion source 5 and on the exposed surface portion of substrate 1 so that source 5 is enclosed on three sides by mask 6. Aluminum oxide may be formed by the thermal decomposition of aluminum isopropoxide in an inert or non-oxidizing gas. A detailed description of the method and apparatus utilized in depositing aluminum oxide will be given in connection with FIG. 5. Silicon nitride may be deposited by the thermal decomposition of silicon bromide ($SiBr_4$) and ammonia ($NH_3$) in an inert or non-oxidizing gas. A detailed description of the method and apparatus utilized in depositing silicon nitride on substrate 1 will also be given in connection with the discussion of FIG. 5.

Once diffusion source 5 and mask 6 have been formed on substrate 1, the latter is introduced in a diffusion furnace where heating for appropriate times and temperatures are carried out to diffuse zinc into substrate 1. In FIG. 2, using 2000 A. of zinc silicate as diffusion source 5 and 2000 A. of silicon nitride as mask 6 and heating for 45 minutes at 850° C. results in the formation of a diffused region containing zinc having a depth of 15 microns. The lateral diffusion width is no more than the vertical diffusion depth.

The amount of zinc oxide in the zinc silicate preferably should be less than fifty percent of the total. The actual amount used, however, depends upon the properties of the diodes desired, for example.

Figure 3:
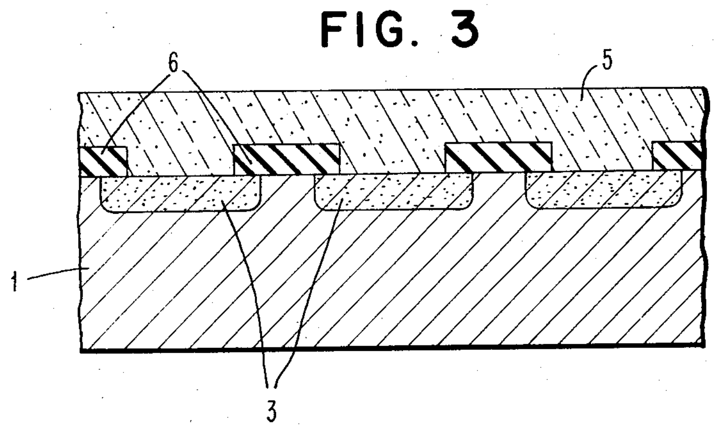
FIG. 3 shows a cross-sectional view of a semiconductor substrate with a masking material disposed on its surface enclosed on three sides by a zinc silicate diffusion source.

Another approach which eliminates excessive lateral diffusion or winging is shown in FIG. 3. In FIG. 3, a substrate 1 is shown containing a plurality of mask regions 6 with a diffusion source 5 disposed on the mask regions 6 and on the exposed surfaces of substrate 1. Diffused regions 3 are formed by the diffusion of zinc from a zinc silicate diffusion source 5. Mask regions 6 are either aluminum oxide or silicon nitride and the respective regions are deposited in the same manner as briefly described in connection with FIG. 2. The difference between the arrangement of FIG. 3 and that of FIG. 2 is simply in the order of deposition and in the etching of a different material. In FIG. 3, aluminum oxide or silicon nitride is deposited first and mask regions 6 are formed by well known photolithographic techniques. Once the unexposed regions of a photoresist have been removed by an appropriate solvent, an etch is applied which removes the aluminum oxide or the silicon nitride from the unmasked regions. An appropriate etch for aluminum oxide is diluted HF. An appropriate etch for silicon nitride is diluted HF. When etching is completed, deposition of the zinc silicate diffusion source 5 is carried out. After deposition, substrate 1 is placed in a diffusion furnace where heating is carried out for appropriate times and temperatures to diffuse zinc to a desired depth in substrate 1 resulting in the formation of diffusion regions 3. As in the instance of FIG. 2, diffused regions 3 of FIG. 3 do not extend laterally a greater distance than the depth of diffusion.

Figure 4:
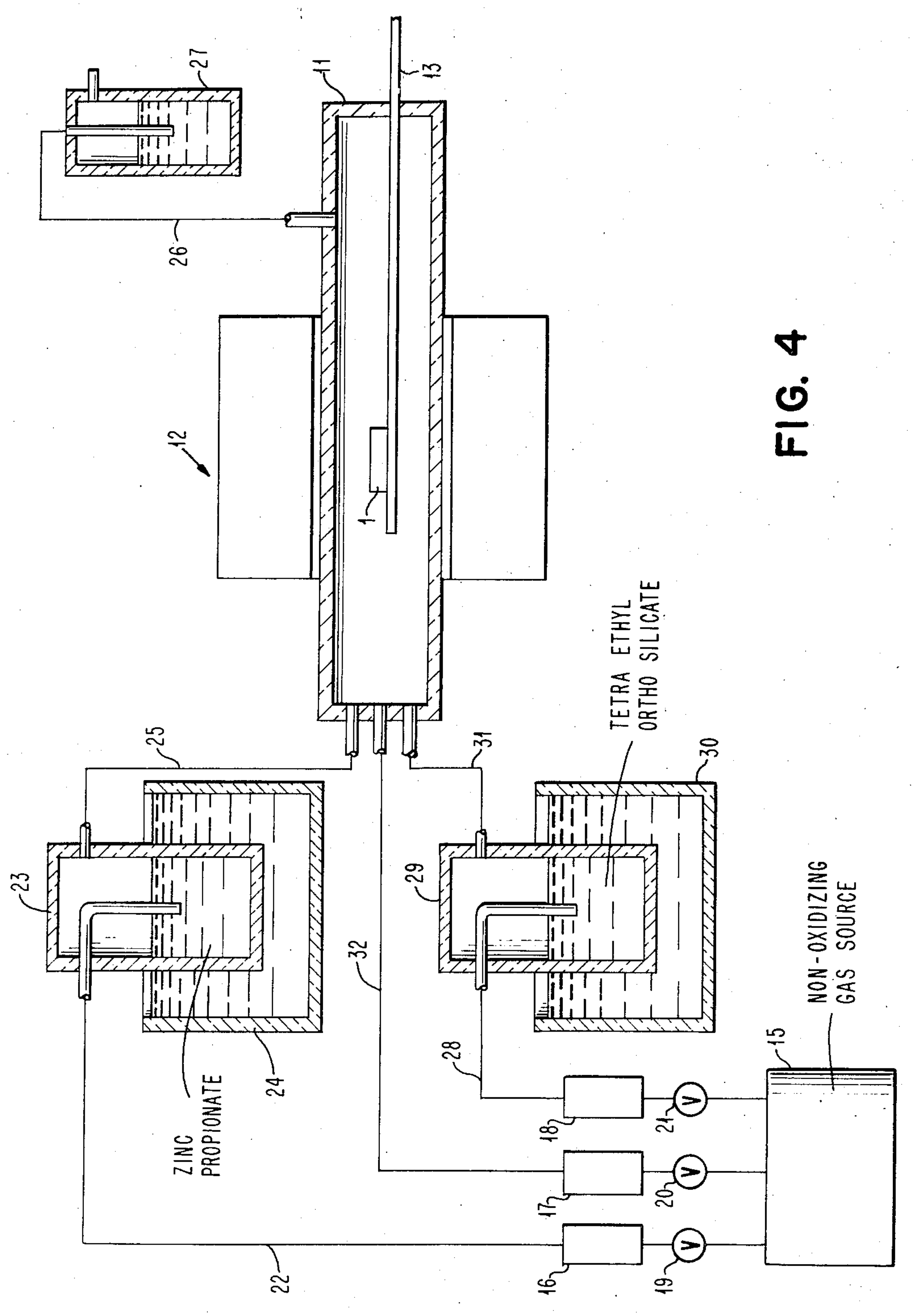
FIG. 4 is a partial cross-sectional schematic drawing of apparatus used to deposit zinc silicate on the surface of a semiconductor substrate.

Referring now to FIG. 4, there is shown a preferred apparatus in which the deposition of zinc silicate is accomplished by the thermal decomposition of zinc propionate and tetraethyl ortho silicate. The method of the present invention will be described below in connection with a gallium arsenide semiconductor substrate, with nitrogen as the ambient gas and with tetraethyl ortho silicate, hereinafter referred to as TEOS, as a source for silicon dioxide and zinc propionate as a source of zinc oxide.

In FIG. 4, a quartz firing tube 11 is shown disposed within a tube furnace 12. Tube 11 has a removable substrate holder 13, carrying a semiconductor substrate 1 of gallium arsenide disposed within it.

A source 15 of nonoxidizing gas, preferably nitrogen, is shown connected to flowmeters 16, 17, 18 through adjustable valves 19, 20, 21, respectively. Piping 22 extends from flowmeter 16 to a bubbler 23 which contains an organic alkoxide of zinc, preferably zinc propionate. This latter material is normally a solid at room temperature, so it must be heated to a temperature sufficient to liquefy it in a constant temperature bath 24. Temperatures in the range of 118°–270° C. have been found suitable with a temperature of 240° C. as a preferred temperature. The organic compound utilized is one which decomposes upon heating to a proper temperature to form a deposit of a metal oxide, zinc oxide, in this instance. The only criterion relative to the decomposition temperature of the organic metal oxide compound is that the decomposition temperature be below the temperature at which the elements of the metal oxide normally diffuse into a semiconductor substrate. For zinc propionate, decomposition temperatures in the range of 250° C.–600° C. have been found suitable with a temperature of 450° C. being the preferred decomposition temperature. The zinc propionate is introduced into tube 11 by flowing nitrogen from source 15, through piping 22 to bubbler 23, where the nitrogen bubbles through the liquid zinc propionate which is carried as a vapor mixture with nitrogen via piping 25 into tube 11.

Simultaneously with the introduction of zinc propionate in vapor form into tube 11, a nonoxidizing gas, nitrogen, is flowed from gas source 15, through valve 21 and flowmeter 18, via piping 28 into bubler 29 which contains an organic hydroxy salt of silicon, preferably, TEOS. Constant temperature bath 30 maintains the TEOS in liquid form at any temperature in the range of −20° to 50° C. Nitrogen bubbling through the TEOS carries vaporized TEOS via piping 31 to tube 11. In tube 11, zinc propionate and TEOS decompose at a temperature in the range of 250° C.–600° C., preferably 450° C., in the region of substrate 1 and deposit zinc silicate on substrate 1.

With valves 19, 21 set for desired flow rates, zinc propionate and TEOS are carried to tube 11 where they decompose simultaneously as zinc silicate on substrate 1. Because the range of temperatures over which the organic compound chosen decomposes is rather wide and because a narrow temperature gradient cannot be easily maintained in the region of substrate 1, a separate flow of nitrogen or oxygen, if necessary, to increase the flow velocity in tube 11 is utilized to insure the deposition of zinc silicate on substrate 1. Thus, nitrogen from source 15 is delivered through valve 20 and flowmeter 17 via piping 32 to tube 11 in excess quantity at a desired flow rate.

Flow rates of 1 liter/minute of nitrogen through both the zinc propionate and the TEOS bubblers 23, 29 respectively and 8 liters/minute of nitrogen or oxygen introduced directly via piping 32 to tube 11 are typical. By adjusting the flow rate of nitrogen through the zinc propionate, the proportion of zinc oxide to silicon dioxide can be controlled. As indicated hereinabove, zinc oxide should be present in amounts less than fifty percent by weight.

Thus, zinc silicate is formed on the surface of substrate 1 as shown in FIG. 2 by means of the apparatus of FIG. 4. After delineation of a zinc silicate diffusion source 5, masking material 6 of either aluminum oxide or silicon nitride is formed using the apparatus shown in FIG. 5.

Figure 5:
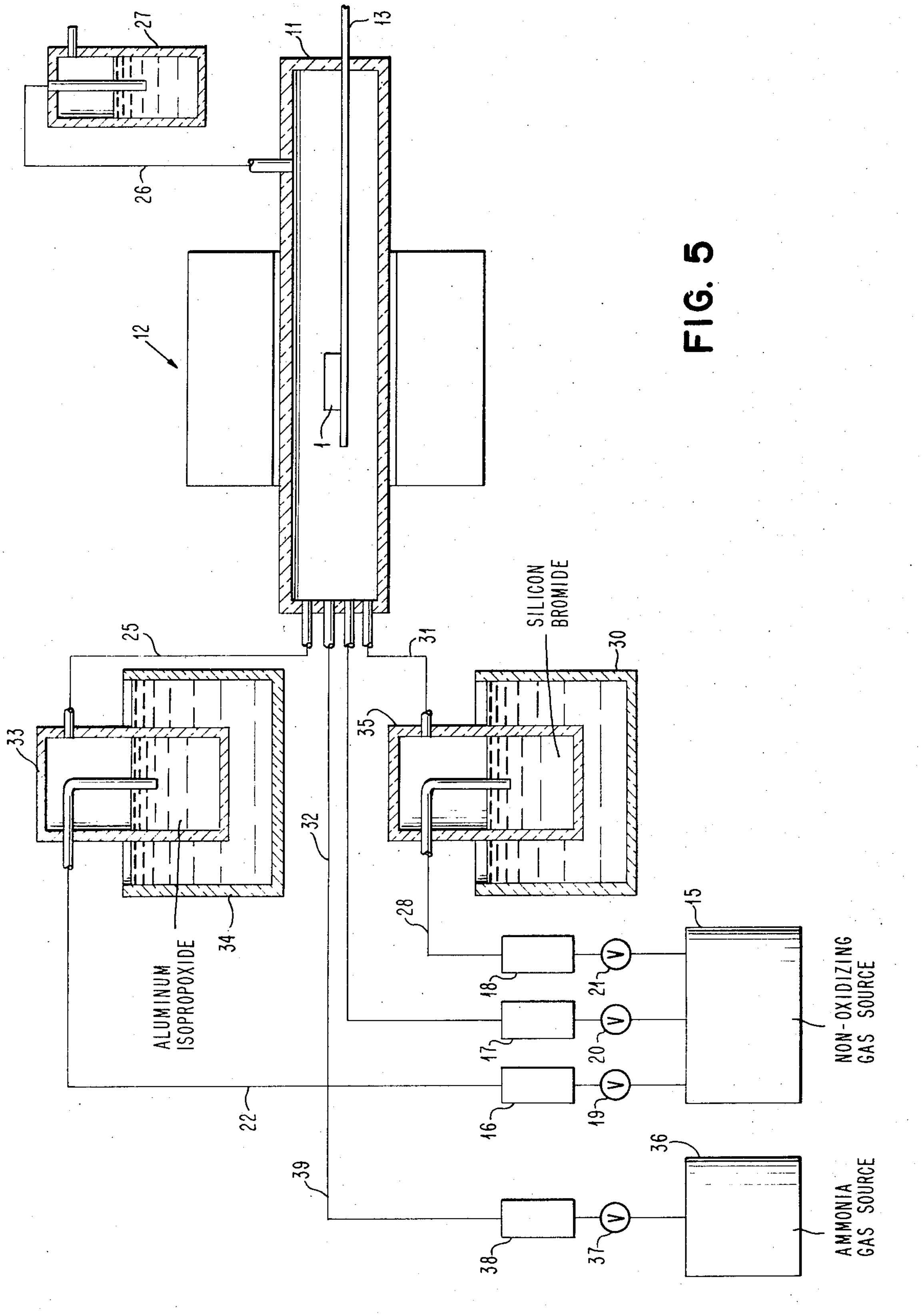
FIG. 5 is a partial cross-sectional schematic drawing of apparatus used to deposit either aluminum oxide or silicon nitride on the surface of a semiconductor substrate.

Referring now to FIG. 5, there is shown a preferred apparatus in which the deposition of aluminum oxide or silicon nitride is accomplished by the thermal decomposition of organic metal oxide containing compounds and the thermal decomposition of silicon bromide and ammonia, respectively. The deposition of these materials will be described below in connection with a gallium arsenide semiconductor substrate, with nitrogen as the ambient gas, with aluminum isopropoxide as a source of aluminum oxide, and with silicon bromide and ammonia as a source of silicon nitride.

In FIG. 5, a quartz firing tube 11, is shown disposed within a tube furnace 12. Tube 11 has a removable substrate holder 13, carrying a semiconductor substrate 1 of gallium disposed within it.

A source 15 of nonoxidizing gas, preferably nitrogen, is shown connected to flowmeters 16, 17, 18 through adjustable valves 19, 20, 21 respectively. Piping 22 extends from flowmeter 16 to a bubbler 33 which contains an organic alkoxide of aluminum, preferably aluminum isopropoxide. This latter material is normally a solid at room temperature, so it must be heated to a temperature sufficient to liquefy it in a constant temperature bath 34. Temperatures in the range of 118°–270° C. have been found suitable with a temperature of 125° C. as a preferred temperature. The organic compound utilized is one which decomposes upon heating to a proper temperature to form a deposit of aluminum oxide. The only criterion relative to the decomposition temperature of the organic metal oxide compound is that the decomposition temperature be below the temperature at which the elements of the metal oxide normally diffuse into a semiconductor substrate. For aluminum isopropoxide, decomposition temperatures in the range of 250° C–600° C. have been found suitable with a temperature of 420° C. being the preferred decomposition temperature. The aluminum isopropoxide is introduced into tube 11 by flowing nitrogen from source 15, through piping 22 to bubbler 33, where the nitrogen bubbles through the liquid aluminum isopropoxide which is carried as a vapor mixture with nitrogen via piping 25 into tube 11. Substrate 1 is heated by furnace 12 to the desired decomposition temperature and the aluminum isopropoxide on coming in contact with the heated surface of substrate 1 decomposes and deposits as a film of aluminum oxide. The remaining decomposition products along with nitrogen exit from tube 11 via tubing 21 through exhaust bubbler 27 to the atmosphere. In the foregoing manner, aluminum oxide is deposited on diffusion source 5 and on the exposed surface portion of substrate 1 as shown in FIG. 2. Heating to accomplish diffusion of zinc from the zinc silicate may be carried out in tube 11 by simply heating in nitrogen.

To provide a mask of silicon nitride instead of aluminum oxide, nitrogen is flowed from gas source 15, through valve 21 and flowmeter 18, via piping 28 into bubbler 35 which contains silicon bromide in liquid form. Constant temperature bath 30 maintains the silicon bromide at a temperature of 25° C. Nitrogen bubbling through the silicon bromide carries vaporized silicon bromide via piping 31 to tube 11.

At the same time, ammonia is passed from ammonia gas source 36 via valve 37, flowmeter 38 and piping 39 directly to tube 11 where at a temperature of 800° C.–900° C. the ammonia and silicon bromide decompose and react to form a layer of silicon nitride over the exposed portion of substrate 1 and over diffusion source 5 of zinc silicate. During this reaction, valve 19 is closed to prevent this flow of aluminum isopropoxide to tube 1. In addition to the flow of ammonia and silicon bromide vapor, excess nitrogen is introduced into tube 1 from gas source 15 via valve 20, flowmeter 17 and piping 32. After deposition of the silicon nitride, heating to cause diffusion of zinc into substrate 1 may be carried out in tube 11 in nitrogen only.

Where a configuration such as shown in FIG. 3 is desired, mask portions 6 may be provided by first depositing a layer of either aluminum oxide or silicon nitride in the same manner as described in connection with FIG. 5. After delineating openings, diffusion source 5 may be deposited in the same manner as described in connection with FIG. 4. Heating, of course, causes diffusion of zinc into substrate 1.

While the invention has been particularly shown and described with reference to preferred embodiments thereof, it will be understood by those skilled in the art that changes in the steps and details may be made without departing from the spirit of the invention.

What is claimed is:

1. A method for diffusing zinc into a semiconductor substrate without excessive lateral spreading of the diffused zinc comprising the steps of:

forming a zinc silicate diffusion source and a masking material selected from the group consisting of aluminum oxide and silicon nitride on first and second portions, respectively, of the surface of said substrate, and heating to diffuse zinc from said diffusion source into said substrate.

2. A method according to claim 1 wherein the step of forming a diffusion source and a masking material includes the steps of:

depositing a layer of zinc silicate on the surface of said substrate, selectively removing at least a portion of said layer to leave a desired configuration, depositing a layer of said masking material on the remaining portion of said zinc silicate layer and on the exposed surface of said substrate, and diffusing zinc from said remaining portion of said zinc silicate into said substrate.

3. A method according to claim 1 wherein the steps of forming a diffusion source and a masking material includes the steps of:

depositing a layer of said masking material on the surface of said substrate, selectively removing at least a portion of said layer of said masking material to leave a desired configuration, depositing a layer of said zinc silicate on the remaining portion of said masking material and on the exposed surface of said substrate, and diffusing zinc from said zinc silicate into said substrate.

4. A method according to claim 1 wherein said semiconductor substrate is a compound formed from elements of Groups III and V of the Periodic Table of the Elements.

5. A method according to claim 1 wherein said semiconductor substrate is gallium arsenide.

6. A method according to claim 1 wherein said semiconductor substrate is gallium aluminum arsenide.

7. A method according to claim 1 wherein said zinc silicate diffusion source contains zinc oxide in an amount less than 50 percent by weight of zinc silicate.

8. A method according to claim 2 wherein the step of depositing a layer of zinc silicate includes the step of:

simultaneously heating zinc propionate and tetraethyl ortho silicate in the vapor phase to their decomposition temperatures to deposit a layer of zinc silicate.

9. A method according to claim 2 wherein the step of depositing a layer of said masking material includes the step of:

heating aluminum isopropoxide in the vapor phase to its decomposition temperature to deposit a layer of aluminum oxide.

10. A method according to claim 2 wherein the step of depositing a layer of said masking material includes the step of:

heating silicon bromide and ammonia in the vapor phase to their decomposition temperature to cause elements thereof to react and deposit as a layer of silicon nitride.

11. A method according to claim 3 wherein the step of depositing a layer of said masking material includes the step of:

heating aluminum isopropoxide in the vapor phase to the decomposition temperature to deposit a layer of aluminum oxide.

12. A method according to claim 3 wherein the step of depositing a layer of said masking material includes the step of:

heating silicon bromide and ammonia in the vapor phase to their decomposition temperatures to cause elements thereof to react and deposit as a layer of silicon nitride.

13. A method according to claim 3 wherein the step of depositing a layer of zinc silicate includes the step of:

simultaneously heating zinc propionate and tetraethyl ortho silicate in the vapor phase to their decomposition temperatures to deposit a layer of zinc silicate.

14. A method for diffusing zinc into gallium arsenide substrate without lateral spreading of the diffusion comprising the steps of:

forming a diffusion source of zinc silicate in contact with a portion of the surface of said gallium arsenide substrate, forming on another portion of the surface of said substrate a masking material selected from the group consisting of aluminum oxide and silicon nitride, and heating to diffuse zinc from said diffusion source into said substrate.

15. A method according to claim 14 wherein said zinc silicate is $x\mathrm{ZnO}\cdot y\mathrm{SiO_2}$ and ZnO appears in amounts less than fifty percent by weight of said zinc silicate.

References Cited

UNITED STATES PATENTS

| | | | |
|---|---|---|---|
| 3,352,725 | 11/1967 | Antell | 148—188 X |
| 3,479,237 | 11/1969 | Bergh et al. | 156—11 |
| 2,944,975 | 7/1960 | Folberth | 252—62.3 |
| 3,406,049 | 10/1968 | Marinace | 148—187 |
| 3,514,348 | 8/1970 | Ku | 148—188 |
| 3,532,564 | 10/1970 | Gittler | 148—188 |

OTHER REFERENCES

Becke et al., "Gallium Arsenide FET's etc.," Electronics, June 12, 1967, pp. 82–90.

Woodall et al., "Liquid Phase Epitaxial Growth of $Ga_{1-x}Al_xAs$," J. Electrochem. Soc.: Electrochem. Tech., June 1969, pp. 899–903.

HYLAND BIZOT, Primary Examiner

J. M. DAVIS, Assistant Examiner

U.S. Cl. X.R.

148—33